US008071438B2

(12) United States Patent
Lee

(10) Patent No.: US 8,071,438 B2
(45) Date of Patent: Dec. 6, 2011

(54) SEMICONDUCTOR CIRCUIT

(75) Inventor: Sang-Yun Lee, Beaverton, OR (US)

(73) Assignee: BeSang Inc., Beaverton, OR (US)

( * ) Notice: Subject to any disclaimer, the term of this patent is extended or adjusted under 35 U.S.C. 154(b) by 0 days.

(21) Appl. No.: 12/874,866

(22) Filed: Sep. 2, 2010

(65) Prior Publication Data

US 2011/0053332 A1    Mar. 3, 2011

Related U.S. Application Data

(60) Division of application No. 12/040,642, filed on Feb. 29, 2008, now Pat. No. 7,800,199, and a continuation-in-part of application No. 11/873,719, filed on Oct. 17, 2007, and a continuation-in-part of application No. 11/873,769, filed on Oct. 17, 2007, and a continuation-in-part of application No. 11/606,523, filed on Nov. 30, 2006, now Pat. No. 7,888,764, and a continuation-in-part of application No. 11/378,059, filed on Mar. 17, 2006, and a continuation-in-part of application No. 11/180,286, filed on Jul. 12, 2005, and a continuation-in-part of application No. 11/092,500, filed on Mar. 29, 2005, now Pat. No. 8,018,058, and a continuation-in-part of application No. 11/092,501, filed on Mar. 29, 2005, and a continuation-in-part of application No. 11/092,521, filed on Mar. 29, 2005, now Pat. No. 7,633,162, and a continuation-in-part of application No. 10/873,969, filed on Jun. 21, 2004, now Pat. No. 7,052,941.

(30) Foreign Application Priority Data

Jun. 24, 2003  (KR) .......................... 10-2003-0040920
Jul. 12, 2003  (KR) .......................... 10-2003-0047515

(51) Int. Cl.
*H01L 21/02* (2006.01)
(52) U.S. Cl. .................. 438/239; 257/E21.506; 438/381
(58) Field of Classification Search ................... 438/239
See application file for complete search history.

(56) References Cited

U.S. PATENT DOCUMENTS

| 4,704,785 A | 11/1987 | Curran |
| 4,732,312 A | 3/1988 | Kennedy et al. |
| 4,829,018 A | 5/1989 | Wahlstrom |
| 4,854,986 A | 8/1989 | Raby |
| 4,939,568 A | 7/1990 | Kato et al. |
| 5,047,979 A | 9/1991 | Leung |
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,250,460 A | 10/1993 | Yamagata et al. |
| 5,265,047 A | 11/1993 | Leung et al. |
| 5,266,511 A | 11/1993 | Takao |
| 5,277,748 A | 1/1994 | Sakaguchi et al. |
| 5,308,782 A | 5/1994 | Mazure et al. |

(Continued)

*Primary Examiner* — Thao P. Le
(74) *Attorney, Agent, or Firm* — Schmeiser Olsen & Watts LLP

(57) ABSTRACT

A semiconductor memory device includes a substrate and an interconnect region carried by the substrate. A donor layer is coupled to the interconnect region through a bonding interface. An electronic device is formed with the donor layer, wherein the electronic device is formed after the bonding interface is formed. A capacitor is connected to the electronic device so that the electronic device and capacitor operate as a dynamic random access memory device.

39 Claims, 10 Drawing Sheets

U.S. PATENT DOCUMENTS

| | | |
|---|---|---|
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,554,870 A | 9/1996 | Fitch et al. |
| 5,563,084 A | 10/1996 | Ramm et al. |
| 5,617,991 A | 4/1997 | Pramanick et al. |
| 5,627,106 A | 5/1997 | Hsu |
| 5,695,557 A | 12/1997 | Yamagata et al. |
| 5,737,748 A | 4/1998 | Shigeeda |
| 5,829,026 A | 10/1998 | Leung et al. |
| 5,835,396 A | 11/1998 | Zhang |
| 5,854,123 A | 12/1998 | Sato et al. |
| 5,882,987 A | 3/1999 | Srikrishnan |
| 5,892,225 A | 4/1999 | Okihara |
| 5,915,167 A | 6/1999 | Leedy |
| 5,937,312 A | 8/1999 | Iyer et al. |
| 5,977,579 A | 11/1999 | Noble |
| 5,980,633 A | 11/1999 | Yamagata et al. |
| 5,998,808 A | 12/1999 | Matsushita |
| 6,009,496 A | 12/1999 | Tsai |
| 6,057,212 A | 5/2000 | Chan et al. |
| 6,103,597 A | 8/2000 | Aspar et al. |
| 6,153,495 A | 11/2000 | Kub et al. |
| 6,222,251 B1 | 4/2001 | Holloway |
| 6,229,161 B1 | 5/2001 | Nemati et al. |
| 6,242,324 B1 | 6/2001 | Kub et al. |
| 6,259,623 B1 | 7/2001 | Takahashi |
| 6,331,468 B1 | 12/2001 | Aronowitz et al. |
| 6,380,046 B1 | 4/2002 | Yamazaki |
| 6,380,099 B2 | 4/2002 | Sakaguchi et al. |
| 6,417,108 B1 | 7/2002 | Akino et al. |
| 6,423,614 B1 | 7/2002 | Doyle |
| 6,531,697 B1 | 3/2003 | Nakamura et al. |
| 6,534,382 B1 | 3/2003 | Sakaguchi et al. |
| 6,535,411 B2 | 3/2003 | Jolin et al. |
| 6,555,901 B1 | 4/2003 | Yoshihara et al. |
| 6,600,173 B2 | 7/2003 | Tiwari |
| 6,621,168 B2 | 9/2003 | Sundahl et al. |
| 6,630,713 B2 | 10/2003 | Geusic |
| 6,635,552 B1 | 10/2003 | Gonzalez |
| 6,638,834 B2 | 10/2003 | Gonzalez |
| 6,653,209 B1 | 11/2003 | Yamagata |
| 6,661,085 B2 | 12/2003 | Kellar et al. |
| 6,677,204 B2 | 1/2004 | Cleeves et al. |
| 6,742,067 B2 | 5/2004 | Hsien |
| 6,751,113 B2 | 6/2004 | Bhakta et al. |
| 6,762,076 B2 | 7/2004 | Kim et al. |
| 6,774,010 B2 | 8/2004 | Chu et al. |
| 6,787,920 B2 | 9/2004 | Amir |
| 6,806,171 B1 | 10/2004 | Ulyashin et al. |
| 6,809,009 B2 | 10/2004 | Aspar et al. |
| 6,822,233 B2 | 11/2004 | Nakamura et al. |
| 6,844,243 B1 | 1/2005 | Gonzalez |
| 6,854,067 B1 | 2/2005 | Kutz et al. |
| 6,864,534 B2 | 3/2005 | Ipposhi et al. |
| 6,943,067 B2 | 9/2005 | Greenlaw |
| 6,943,407 B2 | 9/2005 | Ouyang et al. |
| 6,995,430 B2 | 2/2006 | Langdo et al. |
| 7,002,152 B2 | 2/2006 | Grunewald |
| 7,052,941 B2 | 5/2006 | Lee |
| 7,067,396 B2 | 6/2006 | Aspar et al. |
| 7,078,739 B1 | 7/2006 | Nemati et al. |
| 7,109,092 B2 | 9/2006 | Tong |
| 7,148,119 B1 | 12/2006 | Sakaguchi et al. |
| RE39,484 E | 2/2007 | Bruel |
| 7,217,636 B1 | 5/2007 | Atanackovic |
| 7,245,002 B2 | 7/2007 | Akino et al. |
| 7,256,104 B2 | 8/2007 | Ito et al. |
| 7,378,702 B2 | 5/2008 | Lee |
| 7,470,142 B2 | 12/2008 | Lee |
| 7,470,598 B2 | 12/2008 | Lee |
| 7,632,738 B2 | 12/2009 | Lee |
| 7,633,162 B2 | 12/2009 | Lee |
| 7,671,371 B2 | 3/2010 | Lee |
| 7,709,932 B2 | 5/2010 | Nemoto et al. |
| 7,718,508 B2 | 5/2010 | Lee |
| 7,799,675 B2 | 9/2010 | Lee |
| 7,800,199 B2 | 9/2010 | Oh et al. |
| 7,846,814 B2 | 12/2010 | Lee |
| 7,867,822 B2 | 1/2011 | Lee |
| 7,888,764 B2 | 2/2011 | Lee |
| 2002/0024140 A1 | 2/2002 | Nakajima et al. |
| 2002/0025604 A1 | 2/2002 | Tiwari |
| 2002/0141233 A1 | 10/2002 | Hosotani et al. |
| 2003/0067043 A1 | 4/2003 | Zhang |
| 2003/0102079 A1 | 6/2003 | Kalvesten et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0205480 A1 | 11/2003 | Sakaguchi et al. |
| 2003/0224582 A1 | 12/2003 | Shimoda et al. |
| 2004/0014240 A1 | 1/2004 | Takeguchi et al. |
| 2004/0047539 A1 | 3/2004 | Okubora et al. |
| 2004/0113207 A1 | 6/2004 | Hsu et al. |
| 2004/0131233 A1 | 7/2004 | Comaniciu et al. |
| 2004/0147077 A1 | 7/2004 | Watanabe et al. |
| 2004/0155301 A1 | 8/2004 | Zhang |
| 2004/0156233 A1 | 8/2004 | Bhattacharyya |
| 2004/0160849 A1 | 8/2004 | Rinerson et al. |
| 2004/0163478 A1 | 8/2004 | Xu et al. |
| 2004/0259312 A1 | 12/2004 | Schlosser et al. |
| 2004/0262635 A1 * | 12/2004 | Lee ................ 257/199 |
| 2005/0280154 A1 | 12/2005 | Lee |
| 2005/0280155 A1 | 12/2005 | Lee |
| 2005/0280156 A1 | 12/2005 | Lee |
| 2006/0121690 A1 | 6/2006 | Pogge et al. |
| 2006/0275962 A1 | 12/2006 | Lee |
| 2007/0072391 A1 | 3/2007 | Pocas et al. |
| 2007/0190746 A1 | 8/2007 | Ito et al. |
| 2007/0262457 A1 | 11/2007 | Lin |
| 2008/0032463 A1 | 2/2008 | Lee |
| 2008/0048327 A1 | 2/2008 | Lee |
| 2009/0267233 A1 | 10/2009 | Lee |
| 2010/0038743 A1 | 2/2010 | Lee |
| 2010/0133695 A1 | 6/2010 | Lee |
| 2010/0190334 A1 | 7/2010 | Lee |
| 2011/0001172 A1 | 1/2011 | Lee |
| 2011/0003438 A1 | 1/2011 | Lee |
| 2011/0053332 A1 | 3/2011 | Lee |

* cited by examiner

SEMICONDUCTOR CIRCUIT

CROSS-REFERENCE TO RELATED APPLICATIONS

This application is a divisional of, and claims the benefit of, U.S. patent application Ser. No. 12/040,642, filed on Feb. 29, 2008, which issued as U.S. Pat. No. 7,800,199 on Sep. 21, 2010, the contents of which are incorporated by reference as though fully set forth herein.

This application is a continuation-in-part of, and claims the benefit of, U.S. patent application Ser. Nos.:

11/092,500, filed on Mar. 29, 2005,
11/092,501, filed on Mar. 29, 2005;
11/092,521, filed on Mar. 29, 2005;
11/180,286, filed on Jul. 12, 2005;
11/378,059, filed on Mar. 17, 2006; and
11/606,523, filed on Nov. 30, 2006;

which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated by reference as though fully set forth herein.

This application is also a continuation-in-part of, and claims the benefit of, U.S. patent application Ser. No.:

11/873,719, filed on Oct. 17, 2007; and which in turn are divisionals of, and claim the benefit of, U.S. patent application Ser. No. 10/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated by reference as though fully set forth herein.

This application is also a continuation-in-part of, and claims the benefit of, U.S. patent application Ser. No. 11/873,769, filed on Oct. 17, 2007, which in turn is a divisional of, and claims the benefit of, U.S. patent application Ser. No. 10/092,500, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated by reference as though fully set forth herein.

BACKGROUND OF THE INVENTION

1. Field of the Invention

This invention relates to semiconductor circuits formed using wafer bonding.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices that are carried on a single major surface of a substrate. Active devices typically include transistors and passive devices typically include resistors, capacitors, and inductors. However, these laterally oriented devices consume significant amounts of chip area.

It is desirable to provide computer chips that can operate faster so they can process more data in a given amount of time. The speed of operation of a computer chip is typically measured in the number of instructions per second it can perform. Computer chips can be made to process more data in a given amount of time in several ways. In one way, the number of devices included in the computer chip is increased so that it can operate faster because more information can be processed in a given amount of time. For example, if one computer chip operates on 32-bit data, then another computer chip that operates on 64-bit data can process information twice as fast because it can perform more instructions per second. However, the 64-bit computer chip will need more devices since there are more bits to process at a given time.

The number of devices can be increased by making the devices included therein smaller, but this requires expensive advances in lithography and manufacturing equipment. The number of devices can also be increased by keeping their size the same and increasing the area of the computer chip. However, the yield of the computer chips fabricated in a run decreases as their area increases, which increases the overall cost.

Computer chips can also be made faster by decreasing the time it takes to perform certain tasks, such as storing information to and retrieving information from memory. The time needed to store and retrieve information can be decreased by embedding the memory with the computer chip on the same surface as the other devices. However, there are several problems with doing this. One problem is that the masks used to fabricate the memory devices are typically not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area of the computer chip is occupied by memory devices, there is less area for the other devices. The total area of the computer chip can be increased, but as discussed above, this decreases the yield and increases the cost.

BRIEF SUMMARY OF THE INVENTION

The present invention involves a semiconductor circuit, and a method of forming the semiconductor circuit. The invention will be best understood from the following description when read in conjunction with the accompanying drawings.

DETAILED DESCRIPTION OF THE INVENTION

Figure 1:
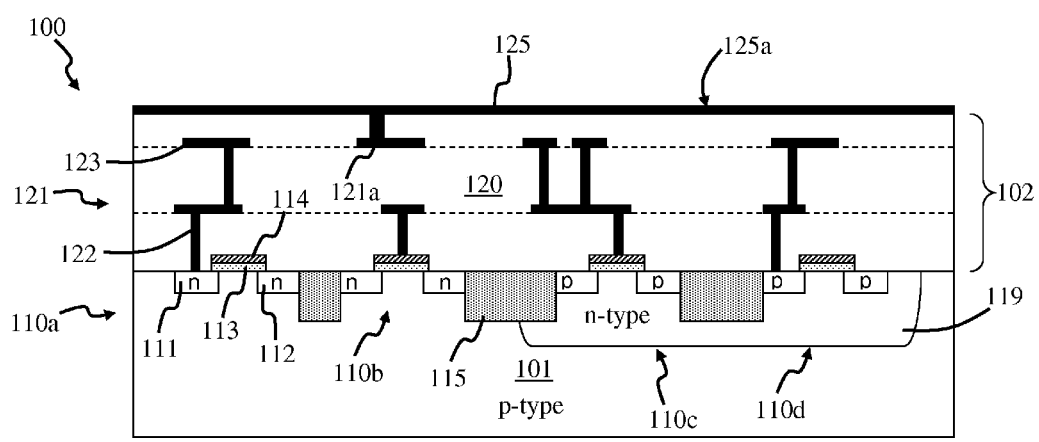
FIGS. 1-9 are sectional views of steps in forming a semiconductor circuit.

FIGS. 1-9 are sectional views of steps in forming a semiconductor circuit 100. Semiconductor circuit 100 can be included in a computer chip having a memory region carried by a carrier substrate, wherein the carrier substrate generally has electronic circuitry formed therewith. The carrier substrate is typically a semiconductor substrate, which includes a semiconductor material such as silicon.

In some embodiments, the electronic circuitry formed with the carrier substrate includes processor and/or control circuitry. The processor circuitry processes data, such as digital data, and the control circuitry controls the flow of the data, such as sending it to and retrieving it from the memory region. The electronic circuitry can include many different types of electronic devices, such as metal-oxide semiconductor field effect transistors (MOSFET). One type of electronic circuitry often used is referred to as complementary MOSFET (CMOS) circuitry.

The memory region can include many different types of memory, such as read only memory (ROM) and/or random access memory. Examples of different types of memory include dynamic random access memory (DRAM), static random access memory (SRAM) and FLASH memory, among others. It should be noted that the electronic circuitry, as well as the memory region, can include horizontally and/or vertically oriented semiconductor devices. More information regarding horizontally and vertically oriented semiconductor devices is provided in the above-identified related patents and patent applications.

It should also be noted that the memory region is often referred to as memory core, wherein the memory core is generally "embedded memory" or "stand-alone memory". Embedded memory is typically positioned so that it, as well as the circuitry, are carried by the same carrier substrate, wherein the circuitry includes processor and/or control circuitry. More information regarding embedded memory can be found in the above-identified patents and patent applications, such as U.S. patent application Ser. No. 11/092,521, entitled "Electronic Circuit with Embedded Memory". One type of embedded memory is often referred to as cache memory, such as L1 and L2 cache memory, wherein the embedded memory is embedded with a central processing unit (CPU). In another embodiment, the embedded memory is embedded with a microcontroller. Examples of a CPU are disclosed in U.S. Pat. Nos. 5,737,748 and 5,829,026, and examples of a microcontroller are disclosed in U.S. Pat. Nos. 6,009,496 and 6,854,067.

Stand-alone memory is typically positioned so that it and processor circuitry are carried by different carrier substrates. It should be noted, however, that stand-alone memory can include control circuitry carried on the same carrier substrate as the memory region. Stand-alone memory is typically included with a memory module, such as those disclosed in U.S. Pat. Nos. 6,742,067, 6,751,113 and 6,535,411. These types of memory modules are pluggable into a printed circuit board, wherein they are in communication with the processor circuitry through the printed circuit board. A printed circuit board generally includes an insulative substrate and conductive interconnects. The processor circuitry and memory region are included in computer chips which are connected together with the conductive interconnects of the printed circuit board. Examples of printed circuit boards are disclosed in U.S. Pat. Nos. 6,621,168 and 6,787,920.

The memory region is typically connected to the electronic circuitry through a conductive interconnect, such as a conductive line and/or conductive via. In this way, signals can flow between the electronic circuitry and memory region through the interconnect region. The signals can include many different types of signals, such as data signals and control signals.

Semiconductor circuit 100 provides several advantages. One advantage is that the memory region is positioned above the electronic circuitry, which is desirable because the memory region typically occupies much more area than the electronic circuitry. Another advantage of semiconductor circuit 100 is that the memory region is positioned closer to the electronic circuitry so that signals can flow between them in less time. This allows semiconductor circuit 100 to operate faster. Still another advantage of semiconductor circuit 100 is that the electronic circuitry can be formed with a different mask set than the memory region. Hence, the masks are less complicated and less expensive to make.

A further advantage is that the memory region is formed with a donor layer after the donor layer has been coupled to the carrier substrate of the electronic circuitry. The donor layer is coupled to the carrier substrate by forming a bonding interface, wherein the bonding interface is formed by exposing the donor layer to heat. The memory region is formed after the donor layer is coupled to the carrier substrate so that the memory region is not exposed to the heat used to form the bonding interface. When the memory region is exposed to heat, the performance of electronic devices included therein can be degraded and their lifetime can be reduced. Another advantage is that the memory region does not need to be aligned with the electronic circuitry of the carrier substrate, because the memory region is formed after the bonding interface is formed. Aligning the memory region with the electronic circuitry of the carrier substrate is a complicated, time-consuming and expensive process, and requires complicated and expensive equipment.

In FIG. 1, partially fabricated semiconductor circuit 100 includes an interconnect region 102 carried by a carrier substrate 101, wherein carrier substrate 101 includes a semiconductor material, such as silicon. In this embodiment, carrier substrate 101 carries a number of horizontally oriented semiconductor devices, which can be included in the processor and/or control circuitry mentioned above. More information regarding carrier substrate 101 and the semiconductor devices can be found in U.S. patent application Ser. No. 11/092,521.

In this embodiment, the horizontal semiconductor devices are embodied as horizontal transistors 110a, 110b, 110c and 110d. Transistors 110a, 110b, 110c and 110d can be of many different types, but here they are embodied as metal oxide field effect transistors (MOSFETs) having a source 111 and drain 112. The MOSFET transistor also includes a gate oxide 113, which extends between source 111 and drain 112, and a control terminal 114 coupled with gate oxide 113. It should be noted that these types of transistors are typically used in CMOS circuitry. In this embodiment, transistors 110a and 110b are NMOS transistors and transistors 110c and 110d are PMOS transistors. Transistors 110c and 110d are PMOS transistors because they are formed with an n-type doped well 119 included with carrier substrate 101, and transistors 110a and 110b are NMOS transistors because they are formed with a p-type doped region of carrier substrate 101.

In this embodiment, semiconductor circuit 100 includes one or more isolation regions. The isolation region is typically positioned between adjacent semiconductor devices formed with carrier substrate 101. For example, in this embodiment, an isolation region 115 is positioned between transistors 110b and 110c. Isolation region 115 can include many different types of materials. For example, it can include semiconductor material that has been heavily damaged, such as by ion implantation. In another embodiment, isolation region 115 includes a dielectric material. In general, isolation region 115 restricts the flow of electrical signals therethrough so that signal interference between adjacent electronic devices is reduced. For example, isolation region 115 is positioned to reduce signal interference between transistors 110b and 110c.

In this embodiment, interconnect region 102 includes a dielectric region 120 with one or more interconnects 121 extending through it. Dielectric region 120 can be formed using many different methods, such as CVD (Chemical Vapor Deposition) and SOG (Spin On Glass). Dielectric region 120 can include many different types of dielectric materials, such as silicon oxide.

Interconnect 121 is typically connected to a horizontal device carried by carrier substrate 101, such as horizontal device 110a, and includes a material which allows a signal to flow therethrough. In this particular embodiment, interconnect 121 is connected to source 111 of horizontal device 110a. In general, an interconnect includes a conductive line and/or via connected together. For example, in this embodiment, interconnect 121 includes conductive line 123 and via 122 connected together.

In some embodiments, region 102 includes a refractory metal. In particular, an interconnect included with interconnect region 102 includes the refractory metal. For example, interconnect 121 can include the refractory metal. There are many different types of refractory metals that can be included with interconnect region 102. Examples of refractory metals include tungsten, molybdenum, tantalum and alloys thereof. Including a refractory metal in interconnect region 102 is useful because in subsequent processing steps, interconnect region 102 is exposed to temperatures in a range from about 800° C. to 1000° C. It is believed that the refractory metal of interconnect region 102 will not substantially degrade when exposed to temperatures in the range from about 800° C. to 1000° C.

In this embodiment, a bonding layer 125 is positioned on interconnect region 102. In particular, bonding layer 125 is positioned on dielectric layer 120. Bonding layer 125 is positioned so that it is spaced from carrier substrate 101 by interconnect region 102. Bonding layer 125 can include one or more material layers. However, layer 125 is shown here as including one layer for simplicity. Bonding layer 125 can include many different types of bonding materials, such as titanium, aluminum, tantalum and alloys thereof. Bonding layer 125 reduces micro-void formation when it is bonded to another material region, as will be discussed in more detail below. In some embodiments, dielectric region 102 includes an interconnect 121a which is connected to bonding layer 125. Interconnect 121a is typically connected to an electronic device of substrate 101, but this is not shown in FIG. 1 for simplicity. Interconnect 121a is useful so that a signal can be flowed to bonding layer 125, wherein the signal is typically a voltage and current signal. In this way, the potential of bonding layer 125 can be controlled.

Figure 2:
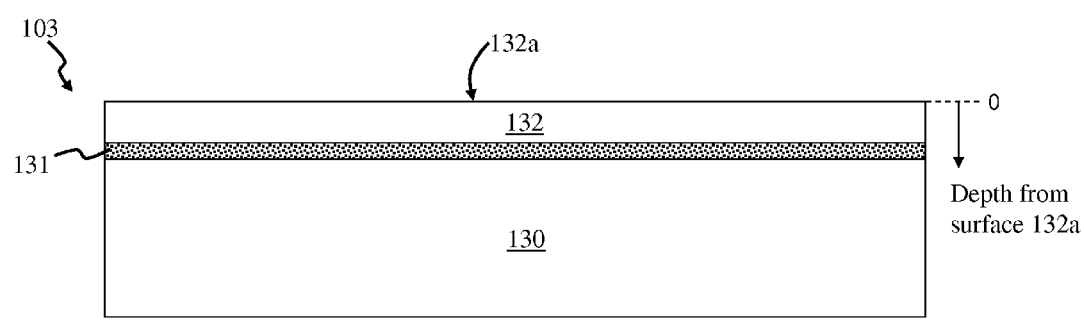

In FIG. 2, a donor structure 103 is provided. In this embodiment, donor structure 103 includes a donor substrate 130 which carries a detach layer 131 and donor layer 132. More information regarding donor structure 103 and detach layer 131 can be found in the above-identified U.S. patent and patent applications, such as U.S. patent application Ser. No. 11/092,501. Detach layer 131 extends between donor layer 132 and substrate 130 so that donor layer 132 can be separated from donor substrate 130, as will be discussed in more detail below. Detach layer 131 can include many different types of materials, such as a porous material and dielectric material. An example of porous material is porous semiconductor material, such as porous silicon, and examples of a dielectric material include silicon oxide and silicon nitride. Using detach layer 131 is useful because it does not require the use of ion implantation, such as when using exfoliating implants, as disclosed in U.S. Pat. No. 6,600,173. Exfoliating implants cause severe damage in response to the heavy dosage required, and it is necessary to reduce the damage with a high temperature anneal. However, the high temperature anneal can damage the components of semiconductor circuit 100, such as the conductive lines and vias of interconnect region 102. Further, the high temperature anneal can degrade the performance of the electronic devices included with semiconductor circuit 100, such as transistors 110a, 110b, 110c and 110d.

It should be noted that donor layer 132 can include many different types of materials, but it generally includes a semiconductor material. The semiconductor material can be of many different types, such as silicon. The semiconductor material is typically crystalline semiconductor material and is formed to have desirable electrical properties. Single crystalline semiconductor material can have localized defects, but it is generally of better material quality than amorphous or polycrystalline semiconductor material. Further, donor layer 132 can include one or more semiconductor layers, but here it is shown as including a single semiconductor layer for simplicity.

In one embodiment, donor layer 132 of FIG. 2 consists essentially of crystalline semiconductor material. In another embodiment, donor layer 132 of FIG. 2 consists of crystalline semiconductor material. It should be noted that in these embodiments, donor layer 132 can include defects, such as impurities, as well as dopants to provide it with a desired conductivity type.

It should also be noted that donor layer 132 is typically doped so that it has a desired doping concentration. In some embodiments, donor layer 132 is doped so that its doping concentration is uniform between a surface 132a and detach layer 132, wherein donor layer 132 extends between surface 132a and detach layer 131. In another embodiment, donor layer 132 is doped so that its doping concentration is non-uniform between surface 132a and detach layer 131. In these embodiments, the doping concentration of donor layer 132 can be less proximate to surface 132a and more proximate to detach layer 131. Further, in these embodiments, the doping concentration of donor layer 132 can be more proximate to surface 132a and less proximate to detach layer 131, as will be discussed in more detail presently. In some embodiments, surface 132a is polished, such as by using chemical mechanical polishing to planarize it. More information regarding polishing a surface is provided in the above identified related patents and patent applications. In this embodiment, surface 132a is a polished semiconductor surface because the material of donor layer 132 adjacent to surface 132a is semiconductor material.

It should be noted that donor layer 132, as shown in FIG. 2, does not include any electronic devices before it is coupled to carrier substrate 101, as will be discussed in more detail with FIGS. 4 and 5. For example, in FIG. 2, donor layer 132 does not include a horizontal transistor and donor layer 132 does not include a vertical transistor. In this way, donor layer 132 consists essentially of a semiconductor material before it is coupled to carrier substrate 101. In some embodiments, donor layer 132 consists of a semiconductor material before it is coupled to carrier substrate 101.

Figure 3:
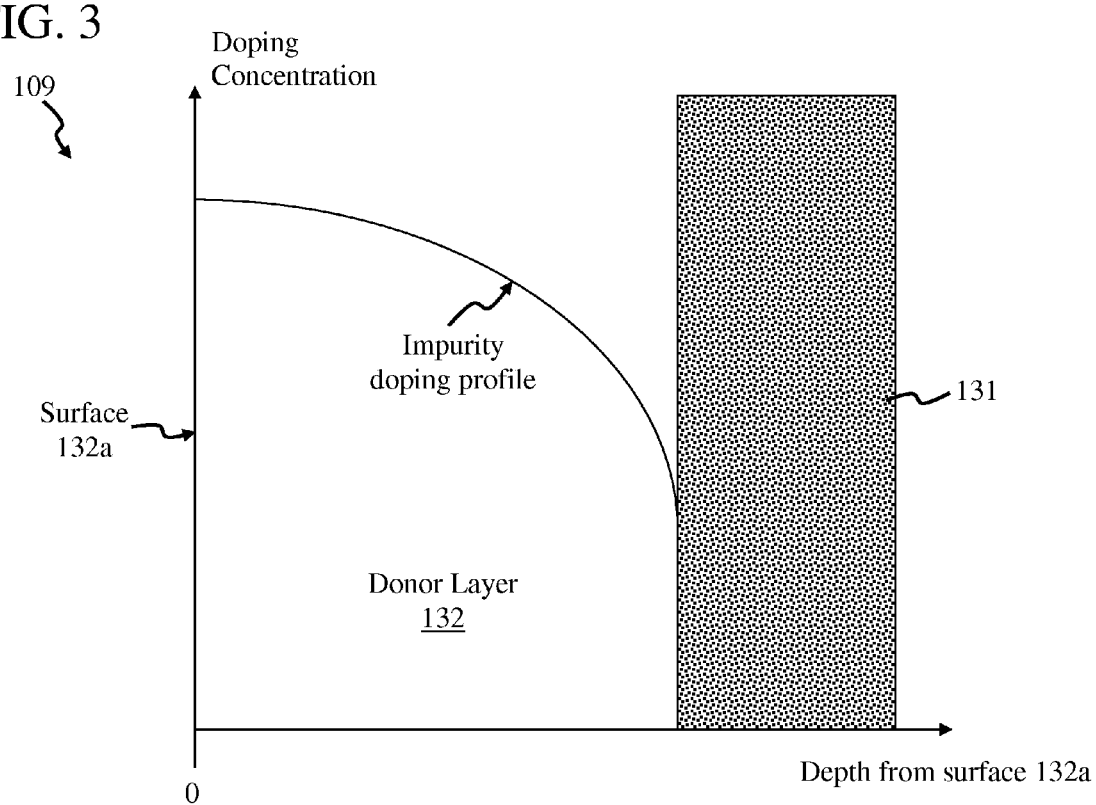

FIG. 3 shows a graph 109 of one embodiment of the doping concentration of donor layer 132 between surface 132a and detach layer 131. The doping concentration is typically indicated by the number of dopants per cubic volume, such as the number of dopants per cubic centimeter. The depth from surface 132a is typically indicated in micrometers (μm). In this example, the doping concentration is greater proximate to surface 132a than the doping concentration proximate to detach layer 131. The non-uniform doping concentration of donor layer 132 will reduce parasitic effects, such as latch-up and punch through, of electronic devices formed therewith. As mentioned above, in other embodiments, the doping concentration is uniform between surface 132a and detach layer 131. Further, in some embodiments, the doping concentration is greater proximate to detach layer 132 and less proximate to surface 132a.

Figure 4:
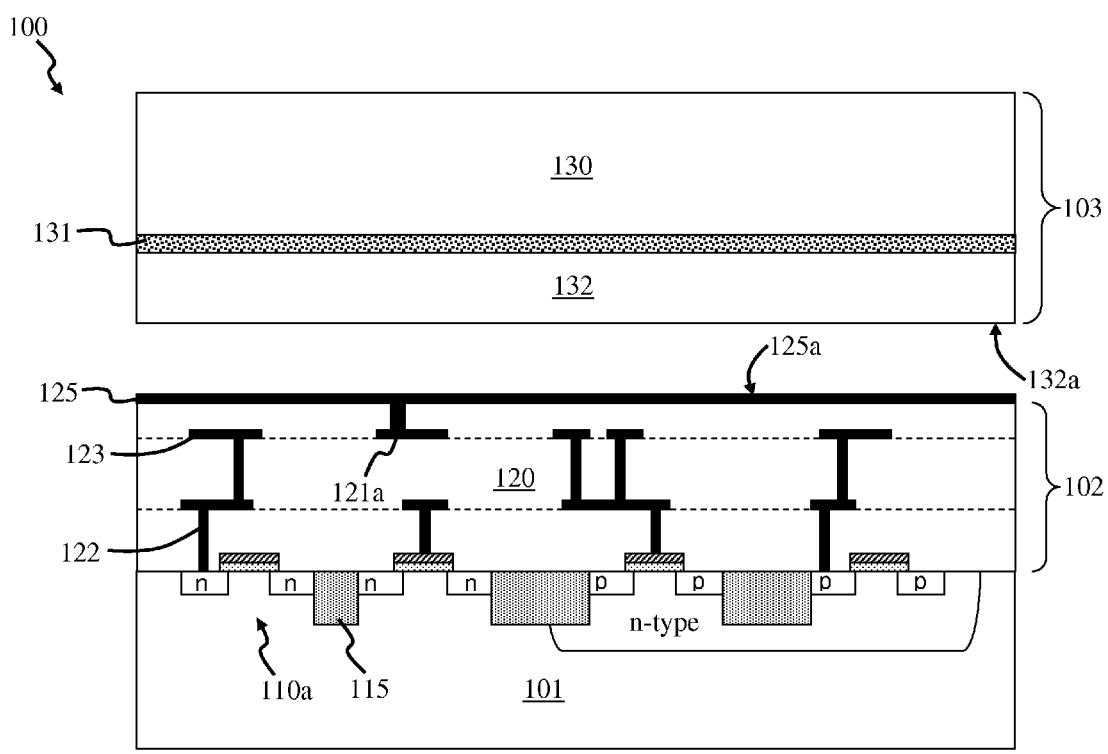

In FIG. 4, donor structure 103 is included with semiconductor circuit 100 by coupling it to carrier substrate 101. Donor structure 103 can be coupled to carrier substrate 101 in many different ways, such as by using wafer bonding. In this embodiment, donor structure 103 is coupled to carrier substrate 101 by bonding donor layer 132 to bonding layer 125. In particular, a surface 132a of donor layer 132 is bonded to a surface 125a of bonding layer 125 to form a bonding interface 108 (FIG. 5). In this way, donor structure 103 is coupled to carrier substrate 101 through a bonding interface and interconnect region 102. Further, donor layer 132 is coupled to carrier substrate 101 through a bonding interface and interconnect region 102.

It should be noted that donor structure 103 can be bonded to bonding layer 125 without using alignment marks, which are typically used to align one substrate with another when both substrates include electronic devices. Aligning the electronic devices of one substrate with the electronic devices of another substrate a complicated, time-consuming and expensive process, so it is desirable to avoid it. As mentioned above, donor layer 132 does not include electronic devices when bonding interface is formed, so the alignment process is less complicated, less time-consuming and less expensive.

It should also be noted that bonding interface 108 is a semiconductor-to-metal bonding interface when bonding layer 125 includes a metal material and donor layer 132 includes a semiconductor material. More information about bonding can be found in the above-identified related patents and patent applications. Bonding interface 108 can be of many different types, such as a metal-to-metal bonding interface. Bonding interface 108 is a metal bonding interface when it is formed in response to bonding a metal layer to another layer. More information regarding bonding interfaces is provided in the above-identified related patents and patent applications.

Bonding interface 108 is typically formed by providing heat to donor layer 132 and/or bonding layer 125, as discussed in more detail in the above references. The heat is provided to donor layer 132 and/or bonding layer 125 by driving their temperature to be between about 350° C. to about 600° C., although temperatures outside of this range can be used. For example, in some embodiments, the heat is provided to donor layer 132 and/or bonding layer 125 by driving their temperature to be between about 300° C. to about 500° C. In one particular example, the heat is provided to donor layer 132 and/or bonding layer 125 by driving their temperature to be between about 375° C. to about 425° C.

It should be noted that the heat provided to donor layer 132 and/or bonding layer 125 is not provided to an electronic device included with donor layer 132 because, as discussed in more detail above, donor layer 132 does not include an electronic device before it is bonded to bonding layer 125. This is useful because the heat provided to donor layer 132 and/or bonding layer 125 can damage an electronic device included with donor layer 132.

In one embodiment, donor layer 132 does not include any electronic devices before it is coupled to carrier substrate 101 through interconnect region 102 and before bonding interface 108 is formed. In some embodiments, donor layer 132 consists essentially of a semiconductor material before it is coupled to carrier substrate 101 and before bonding interface 108 is formed. In some embodiments, donor layer 132 consists of a semiconductor material before it is coupled to carrier substrate 101 and before bonding interface 108 is formed.

Figure 5:
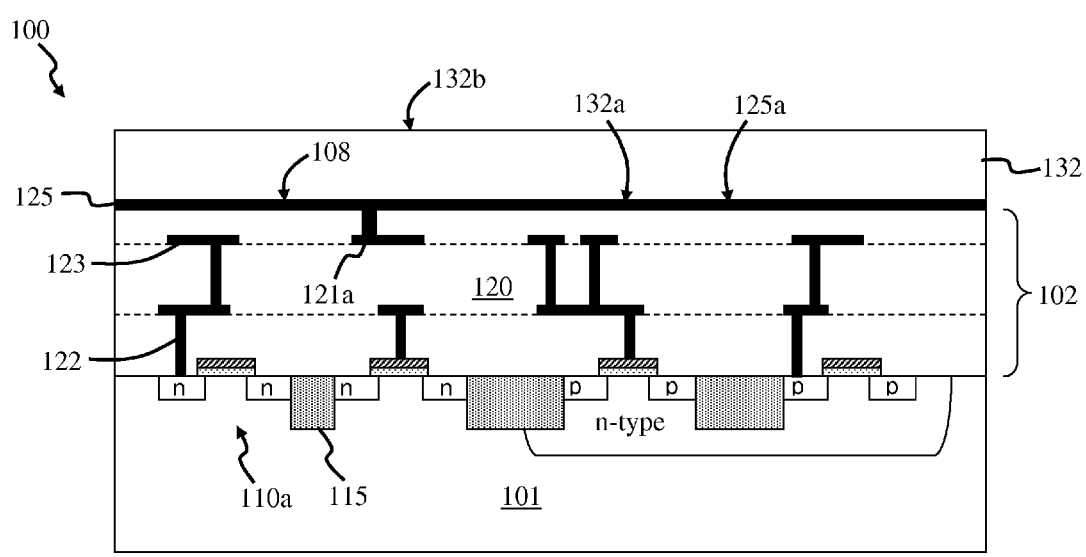

In FIG. 5, donor substrate 130 is decoupled from carrier substrate 101. Donor substrate 130 can be decoupled from carrier substrate 101 in many different ways. In this embodiment, donor substrate 130 is decoupled from carrier substrate 101 by detaching donor substrate 130 from detach layer 131. Donor substrate 130 can be detached from detach layer 131 in many different ways, such as by etching detach layer 131 or by applying a mechanical force to it. More information regarding how to detach donor substrate 130 from detach layer 131 is provided in the above-identified related patents and patent applications. It should be noted that detach layer 131 is typically removed from donor layer 132 when donor substrate 130 is decoupled from carrier substrate 101.

A surface 132b of donor layer 132 is exposed in response to removing detach layer 131 from donor layer 132. Surface 132b is spaced from bonding interface 108 by donor layer 132 and surface 132a is positioned towards bonding layer 125. In some embodiments, surface 132b is processed after donor substrate 130 is decoupled from carrier substrate 101. Surface 132b can be processed in many different ways, such as by etching surface 132b to remove the material of detach layer 131 therefrom. Surface 132b can also be processed to remove defects and/or contaminants therefrom. Surface 132b can also be etched to make it more planar. Surface 132b can be etched in many different ways, such as by using wet and dry etching. Wet etching involves using chemicals and dry etching involves using grinding and polishing, such as chemical mechanical polishing. In some embodiments, surface 132b is polished, such as by using chemical mechanical polishing to planarize it. In this way, donor layer 132 includes opposed polished surfaces. More information regarding polishing a surface is provided in the above-identified related patents and patent applications. In this embodiment, surface 132b is a polished semiconductor surface because the material of donor layer 132 adjacent to surface 132b is semiconductor material.

Figure 6:
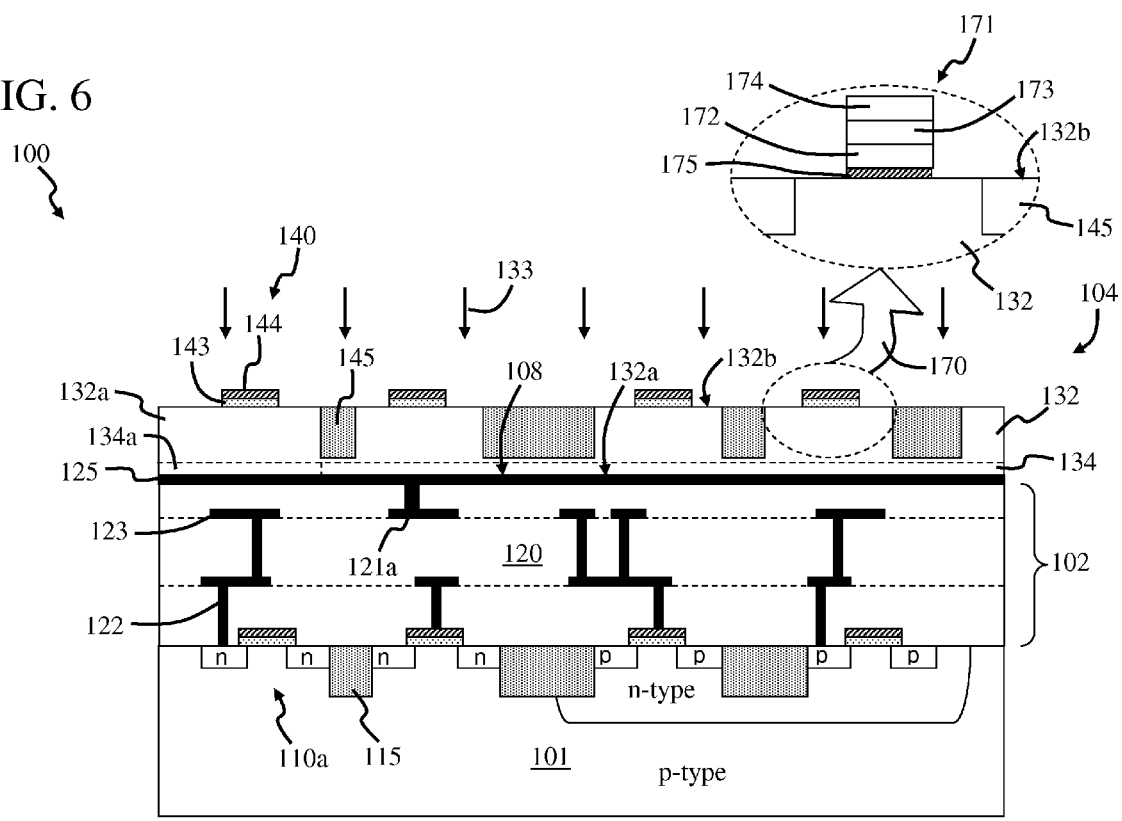

In FIG. 6, one or more electronic devices are formed with donor layer 132 so they are included with a memory region 104. As discussed in more detail below, memory region 104 is connected to the control and/or processor circuitry of carrier substrate 101 through interconnect region 102. It should be noted that memory region 104 can be replaced with another type of electronic circuit, if desired. For example, memory region 104 can be replaced with processor and/or control circuitry connected to the processor and/or control circuitry of carrier substrate 101 through interconnect region 102. Hence, the illustration of memory region 104 in the embodiments included herein is for illustrative purposes.

The electronic devices formed with donor layer 132 can be of many different types. In this embodiment, the electronic devices formed with donor layer 132 are horizontal electronic devices, which can be the same or similar to electronic devices 110a and 110b discussed above. As discussed in more detail below, the electronic devices formed with donor layer 132 can be vertical electronic devices, several different types of which are discussed in more detail in the above-identified references.

In this embodiment, the electronic devices formed with donor layer 132 are formed after bonding interface 108 is formed. Forming the electronic devices after bonding interface 108 is formed is useful so that they are not exposed to the heat used to form bonding interface 108. As mentioned above, the heat used to form bonding interface 108 can damage any electronic devices included with donor layer 132. It should be noted that the electronic devices are typically formed with donor layer 132 using semiconductor device processing techniques that are well-known. These semiconductor device processing techniques generally involve doping, photolithography, masking and etching. The dopants are typically introduced using diffusion doping and ion implantation.

In this embodiment, one or more isolation regions 145 are formed with donor layer 132. Isolation region 145 can be the same or similar to isolation region 115. In general, two isolation regions are formed spaced apart from each other so that an electronic device can be formed between them. In this embodiment, isolation region 145 extends between surface 132*b* and bonding interface 108. In this embodiment, isolation region 145 extends to surface 132*b*. In this embodiment, isolation region 145 does not extend to bonding interface 108 and surface 132*a*.

In this embodiment, a portion 134 of donor layer 132 extends between isolation region 145 and bonding interface 108, as well as between isolation region 145 and bonding layer 125. In some embodiments, portion 134 consists essentially of semiconductor material and, in other embodiments, portion 134 consists of semiconductor material.

In this embodiment, a portion 134*a* of donor layer 132 extends between adjacent isolation regions and bonding interface 108, as well as between adjacent isolation regions and bonding layer 125. Portion 134*a* does not extend between isolation region 145 and bonding interface 108, and portion 134*a* does not extend between isolation region 145 and bonding layer 125. In some embodiments, portion 134*a* consists essentially of semiconductor material and, in other embodiments, portion 134*a* consists of semiconductor material.

In this embodiment, an electronic device 140 is formed with donor layer 132 so it is included with memory region 104. Electronic device 140 includes a dielectric region 143 selectively formed on surface 132*b*. Dielectric region 143 can be selectively formed on surface 132*b* in many different ways, such as by using one or more of the processing techniques mentioned above. Dielectric region 143 can include many different types of dielectric materials, such as silicon oxide and silicon nitride. It should be noted that dielectric layer 143 is formed after bonding interface 108 is formed.

In this embodiment, electronic device 140 includes a control terminal 144 selectively formed on dielectric region 143. Control terminal 144 can be selectively formed on dielectric region 143 in many different ways, such as by using one or more of the processing techniques mentioned above. Control terminal 144 can include many different types of conductive materials, such as a metal and doped polysilicon. It should be noted that control terminal 144 is formed after bonding interface 108 is formed.

Control terminal 144 is often formed at an elevated temperature, which can increase the temperature of interconnect 121. As mentioned above, interconnect 121 includes a refractory metal so that the electrical properties of interconnect 121 are not substantially degraded in response to forming control terminal 144. Control terminal 144 can include many different types of materials, such as a metal and doped poly-silicon.

As indicated by an indication arrow 170, a vertically oriented semiconductor device 171 can be formed with donor layer 132 so it is included with memory region 104. In this embodiment, vertically oriented semiconductor device 171 is bonded to surface 132*b* with a bonding layer 175. More information regarding how a vertically oriented semiconductor device can be formed is provided in the above-identified related patents and patent applications. In this embodiment, vertically oriented semiconductor device 171 includes a stack of semiconductor layers denoted as layers 172, 173 and 174, wherein layer 172 is bonded to surface 132*b* with bonding layer 175. Semiconductor layer 173 is positioned on layer 172, and semiconductor layer 174 is positioned on layer 173.

It should be noted that a plurality of vertically oriented semiconductor devices are typically formed with donor layer 132 in an array of such devices, which are included with memory region 104. However, only one vertically oriented semiconductor device is shown here for illustrative purposes. Further, in some embodiments, both horizontally and vertically oriented semiconductor devices can be formed with donor layer 132, if desired, so that memory region 104 includes both horizontally and vertically oriented semiconductor devices.

Figure 7:
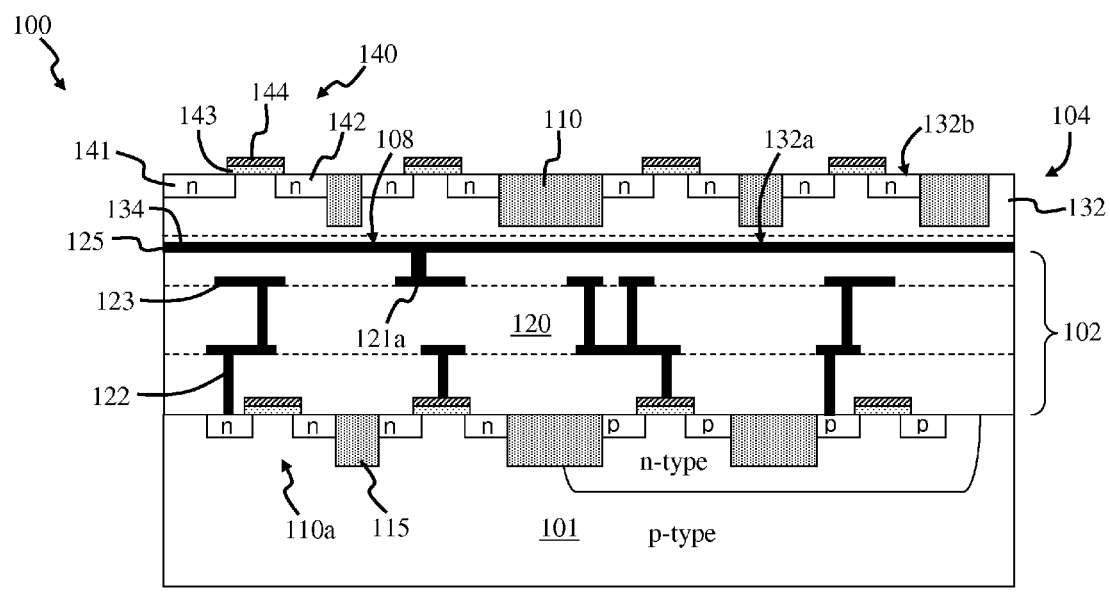

In FIG. 7, electronic device 140 includes a source 141 and drain 142 which are formed with donor layer 132. Source 141 and drain 142 can be formed in many different ways, such as by using diffusion doping. In this embodiment, however, source 141 and drain 142 are formed by implanting a chemical species 133 into donor layer 132 through surface 132*b*. Chemical species 133 is implanted towards bonding interface 108 and bonding layer 125. Chemical species 133 is not implanted through portion 134 and/or portion 134*a*. Chemical species 133 is implanted through surface 132*b* and towards bonding interface 108 and surface 132*a*.

In this embodiment, source and drain 141 and 142 are formed proximate to surface 132*b* and away from bonding interface 108. In this embodiment, portions 134 and 134*a* of donor layer 132 extend between bonding interface 108 and source and drain 141 and 142. In this embodiment, portions 134 and 134*a* of donor layer 132 extend between bonding layer 125 and source and drain 141 and 142.

Donor layer 132 can be annealed at many different temperatures to activate the dopants of source 141 and drain 142, but the annealing temperature is typically between about 800° C. to 1000° C. Interconnect 121 is driven to the anneal temperature because interconnect 121 is positioned proximate to donor layer 132. As mentioned above, interconnect region 102 includes a refractory metal so that the electrical properties of interconnect region 102 are not substantially degraded in response to annealing source 141 and drain 142.

Thus, electronic device 140 is formed with donor layer 132 after donor layer 132 is coupled to carrier substrate 101 through interconnect region 102. Further, electronic device 140 is formed with donor layer 132 so that portion 134*a* extends between device 140 and bonding interface 108 and bonding layer 125. In this way, electronic device 140 is positioned away from bonding interface 108 and bonding layer 125. It should be noted that, in some embodiments, electronic device 140 can be replace with a vertically oriented electronic device, as will be discussed in more detail presently.

Figure 8:
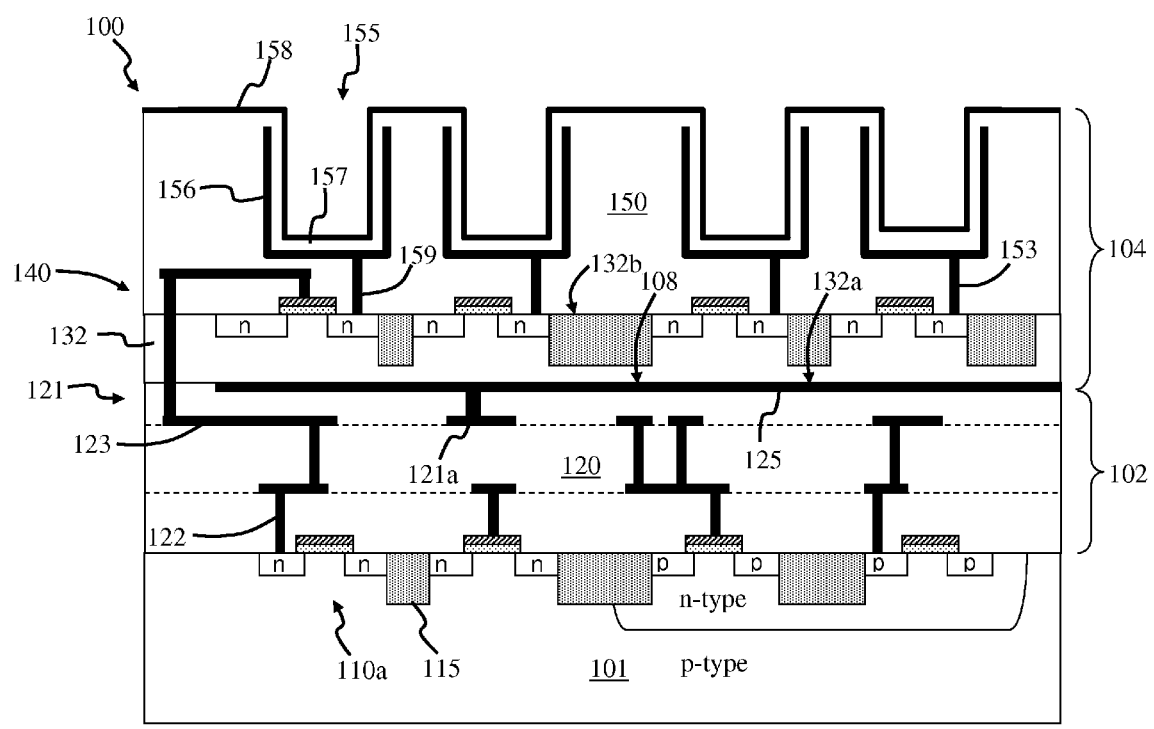

In FIG. 8, interconnect 121 is extended so it is connected to an electronic device included with memory region 104. In this embodiment, interconnect 121 is extended so it is connected to control terminal 144 of electronic device 140. In this way, source 111 is connected to control terminal 144 so that transistors 110*a* and 140 are in communication with each other through interconnect region 102. In this way, interconnect 121 extends from below bonding interface 108 to above bonding interface 108. It should be noted that transistors 110*b*, 110*c* and/or 110*d* can also be connected to memory region 104 with interconnects included with interconnect region 102. However, these interconnects are not shown in FIG. 8.

In this embodiment, one or more capacitors are formed so they are included with memory region 104. The capacitors can be of many different types of capacitors, but here they are vertically oriented capacitors. The capacitors are connected to the electronic devices discussed above, which were formed with donor layer 132. Examples of vertically oriented capacitors are provided in above-referenced U.S. Pat. No. 7,052,941. Another type of capacitor that can be included with memory region 104 is disclosed in U.S. patent application Ser. No. 09/822,489, which was filed on Apr. 2, 2001.

In this embodiment, memory region 104 includes a dielectric region 150 formed on donor layer 132, wherein dielectric region 150 covers the electronic devices formed with donor layer 132. For example, dielectric layer 150 covers transistor 140. In this embodiment, memory region 104 includes a vertically oriented capacitor 155 having a metal layer 156 spaced from a metal layer 158 by a dielectric layer 157, wherein metal layer 156 is connected to drain 142 with an interconnect 159. In this way, vertically oriented capacitor 155 is a metal-insulator-metal capacitor. In other embodiments, capacitor 155 can be a polysilicon-insulator-polysilicon capacitor and a polysilicon-insulator-metal capacitor. In this embodiment, transistor 140 and vertically oriented capacitor 155 operate as a DRAM memory cell. It should be noted that dielectric materials 150 and 157 can be the same or different dielectric materials. It should also be noted that metal layer 158 is typically used as a signal reference.

In operation, the electronic devices of carrier substrate 101 control the operation of the electronic devices of memory region 104. For example, in this embodiment, transistor 110a controls the operation of transistor 140, which controls the operation of vertically oriented capacitor 155. Transistor 140 controls the operation of vertically oriented capacitor 155 by controlling the amount of charge it stores.

Thus, memory region 104, which includes transistor 140 and capacitor 155 connected together to operate as a DRAM memory cell, is formed after bonding interface 108 is formed. In this way, transistor 140 and capacitor 155 are not exposed to the heat used to form bonding interface 108.

Figure 9:
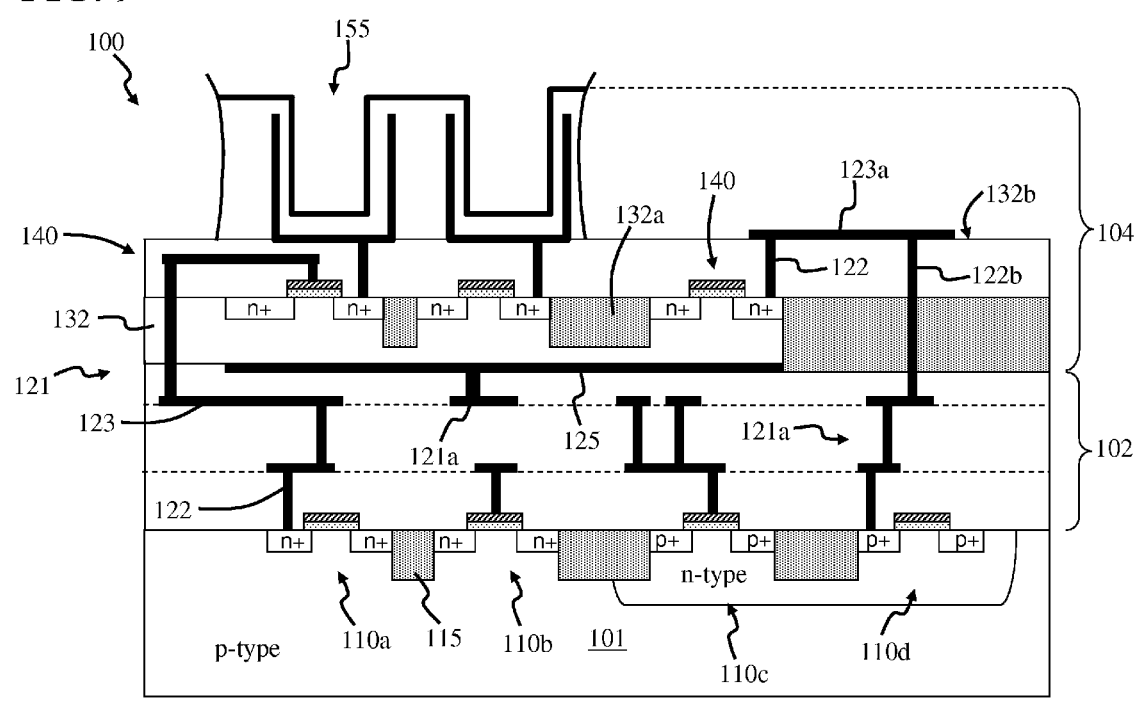
Figure 10:
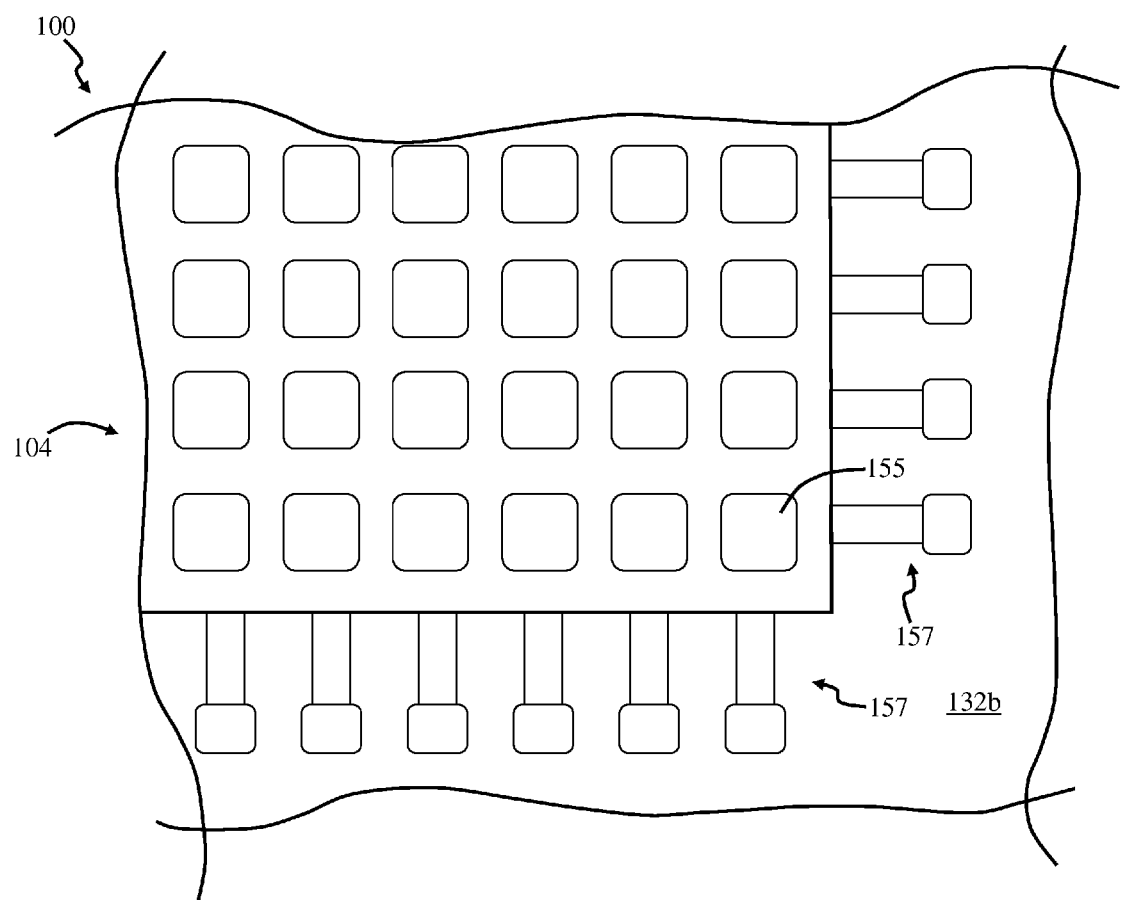
FIG. 10 is a top view of the semiconductor circuit, as shown in FIG. 9.

In FIG. 9, an interconnect 121a is connected to source 100 of transistor 110d and extends upwardly therefrom wherein it is connected to a drain of a transistor 100 of donor layer 132. In this way, transistor 110d can control the operation of transistor 100. It should be noted that transistor 100 is typically connected to a vertically oriented transistor, but this is not shown here for simplicity. In this embodiment, interconnect 121a includes a conductive line 123a which extends along surface 132b. Conductive line 123a can be seen in more detail in a top view of semiconductor circuit 100 as shown in FIG. 10. Interconnect 121a also includes conductive vias 122a and 122b. It should be noted that interconnect 121a can include a refractory metal, such as the refractory metals mentioned above. It should also be noted that, in FIG. 9, only a few memory devices are shown in semiconductor circuit 100, but circuit 100 generally includes a number of memory devices in an array of such devices, as shown in FIG. 10.

Figure 11A:
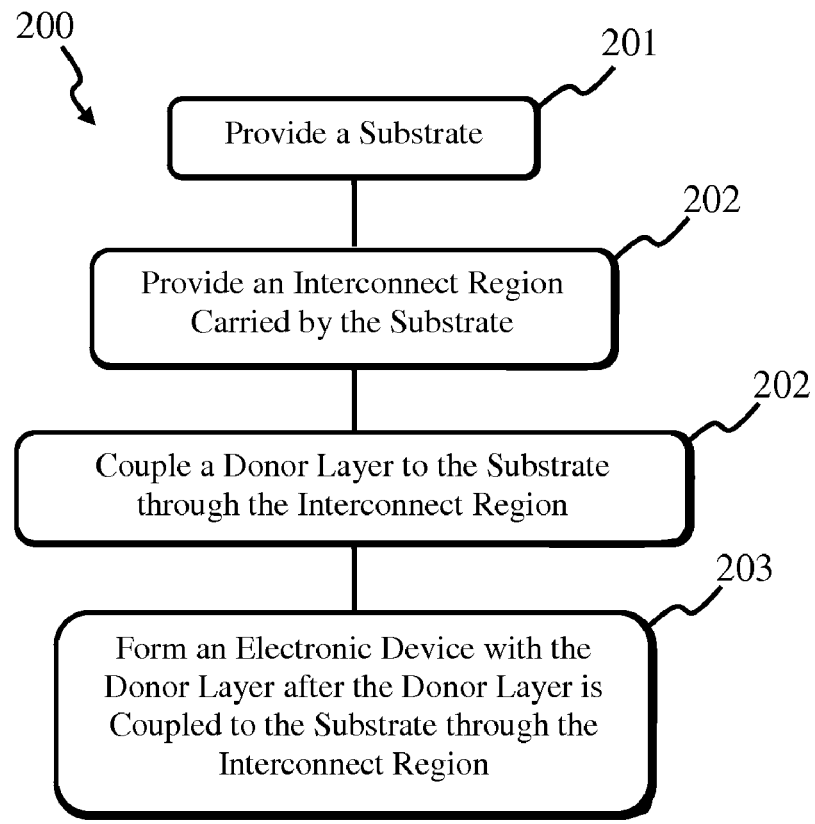
FIGS. 11a and 11b are flow diagrams of methods of forming a semiconductor circuit.

FIG. 11a is a flow diagram of a method 200 of forming a semiconductor circuit. In this embodiment, method 200 includes a step 201 of providing a carrier substrate which carries an interconnect region, and a step 202 of providing a donor layer coupled to a donor substrate with a detach layer. Method 200 includes a step 203 of coupling the donor layer to the carrier substrate through the interconnect region, and a step 204 of decoupling the donor substrate from the detach layer so the donor layer is carried by the carrier substrate. Method 200 includes a step 205 of forming an electronic device with the donor layer.

In some embodiments, the electronic device is formed after the donor layer is coupled to the substrate through the interconnect region. In some embodiments, the detach layer includes a porous silicon material or a dielectric material. In some embodiments, the interconnect region includes a refractory metal. In some embodiments, the donor layer does not include any electronic devices before it is coupled to the substrate through the interconnect region. In some embodiments, a portion of the donor layer between the electronic device and bonding interface consists essentially of semiconductor material. In some embodiments, a portion of the donor layer between the electronic device and bonding interface consists essentially of semiconductor material having one or more types of dopants.

It should be noted that method 200 can include many other steps. In some embodiments, step 203 includes forming a bonding interface. In some embodiments, method 200 includes forming a memory region connected to the electronic device. In these embodiments, the memory region is formed after the donor layer is coupled to the substrate.

Figure 11B:
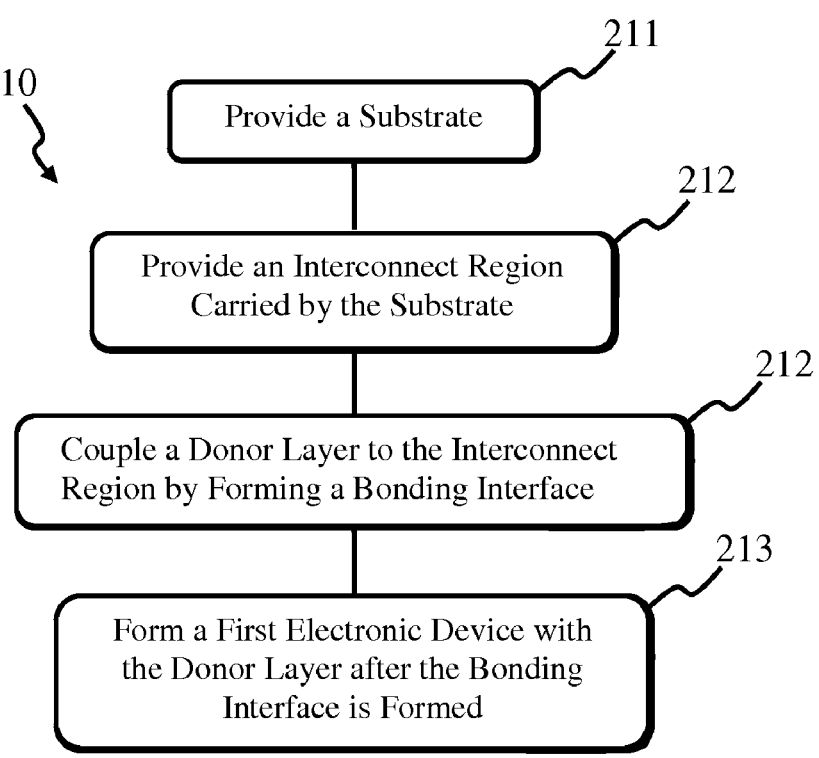

FIG. 11b is a flow diagram of a method 210 of forming a circuit. In this embodiment, method 210 includes a step 211 of providing a carrier substrate which carries an interconnect region, and a step 212 of providing a donor layer coupled to a donor substrate with a detach layer. Method 210 includes a step 213 of coupling the donor layer to the carrier substrate by forming a bonding interface, and a step 214 of decoupling the donor substrate from the detach layer so the donor substrate is carried by the carrier substrate. Method 210 includes a step 215 of forming a first electronic device with the donor layer after the bonding interface is formed.

In some embodiments, the donor layer does not include a second electronic device before the bonding interface is formed. In some embodiments, the donor layer does not include any electronic devices before the bonding interface is formed. In some embodiments, the donor layer consists essentially of a semiconductor material before the bonding interface is formed. In some embodiments, a portion of the donor layer between the first electronic device and bonding interface consists essentially of semiconductor material.

It should be noted that method 210 can include many other steps. In some embodiments, method 210 includes forming a capacitor connected to the first electronic device. In these embodiments, the capacitor is formed after the bonding interface. In these embodiments, the first electronic device and capacitor operate as a dynamic random access memory cell.

While particular embodiments of the invention have been shown and described, numerous variations and alternate embodiments will occur to those skilled in the art. Accordingly, it is intended that the invention be limited only in terms of the appended claims.

The invention claimed is:

1. A method of forming a semiconductor circuit, comprising:
    providing a carrier substrate which carries an interconnect region;
    providing a donor layer coupled to a donor substrate with a detach layer;
    coupling the donor layer to the carrier substrate through a metal bonding layer positioned between the donor layer and interconnect region;
    decoupling the donor substrate from the detach layer so the donor layer is carried by the carrier substrate; and
    forming a first electronic device with the donor layer.

2. The method of claim 1, wherein the interconnect region includes a refractory metal.

3. The method of claim 1, wherein the first electronic device is formed with the donor layer after the donor layer is coupled to the carrier substrate.

4. The method of claim 1, wherein the step of coupling a donor layer to the substrate includes forming a metal bonding interface.

5. The method of claim 1, wherein the donor layer consists essentially of a semiconductor material before the donor layer is coupled to the carrier substrate.

6. The method of claim 1, further including forming a capacitor connected to the first electronic device.

7. The method of claim 6, wherein the capacitor is formed after the donor layer is coupled to the substrate.

8. The method of claim 1, wherein the first electronic device operates as a static random access memory device.

9. The method of claim 1, wherein the first electronic device operates as a non-volatile memory device.

10. The method of claim 1, wherein the detach layer includes porous semiconductor material.

11. The method of claim 1, wherein the detach layer includes dielectric material.

12. A method of forming a semiconductor circuit, comprising:
providing a carrier substrate which carries an interconnect region;
providing a donor layer coupled to a donor substrate with a detach layer;
coupling the donor layer to the carrier substrate by forming a metal-to-metal bonding interface;
decoupling the donor substrate from the detach layer so the donor substrate is carried by the carrier substrate; and
forming a first electronic device with the donor layer after the bonding interface is formed.

13. The method of claim 12, wherein the donor layer does not include a second electronic device before the bonding interface is formed.

14. The method of claim 12, wherein the donor layer consists essentially of a semiconductor material before the bonding interface is formed.

15. The method of claim 12, wherein a portion of the donor layer between the electronic device and bonding interface consists essentially of semiconductor material.

16. The method of claim 12, further including forming a capacitor connected to the electronic device.

17. The method of claim 16, wherein the capacitor is formed after the bonding interface.

18. The method of claim 16, wherein the electronic device and capacitor operate as a dynamic random access memory cell.

19. The method of claim 12, wherein the electronic device operates as a static random access memory device.

20. The method of claim 12, wherein the electronic device operates as a non-volatile memory device.

21. The method of claim 12, wherein the detach layer includes porous semiconductor material.

22. The method of claim 12, wherein the detach layer includes dielectric material.

23. The method of claim 1, wherein the metal bonding layer includes a metal-to-metal bonding interface.

24. The method of claim 1, wherein the metal bonding layer is spaced from the carrier substrate by the interconnect region.

25. The method of claim 1, wherein the interconnect region includes a metal via connected to the metal bonding layer.

26. The method of claim 1, wherein the carrier substrate includes a second electronic device in communication with the first electronic device through an interconnect which includes metal.

27. The method of claim 26, wherein the interconnect extends above and below the metal bonding layer.

28. The method of claim 1, further including forming the metal bonding layer on the interconnect region.

29. The method of claim 1, further including forming the metal bonding layer on the donor layer.

30. The method of claim 1, wherein the metal bonding layer includes a first metal layer formed on the interconnect region and a second metal layer formed on the donor layer.

31. The method of claim 1, wherein the step of providing the donor layer includes forming the donor layer so it has a uniform doping concentration.

32. The method of claim 1, wherein the step of providing the donor layer includes forming the donor layer so it has a non-uniform doping concentration.

33. A method of forming a semiconductor circuit, comprising:
providing a carrier substrate which carries an interconnect region having a metal via;
providing a donor layer coupled to a donor substrate with a detach layer;
coupling the donor layer to the carrier substrate through a metal bonding layer spaced from the carrier substrate by the interconnect region; and
decoupling the donor substrate from the detach layer so the donor layer is carried by the carrier substrate.

34. The method of claim 33, wherein the metal via includes a refractory metal.

35. The method of claim 33, wherein the metal via and metal bonding layer are in communication with each other.

36. The method of claim 33, wherein the metal via and metal bonding layer are connected together.

37. The method of claim 33, wherein the detach layer includes porous semiconductor material.

38. The method of claim 33, wherein the metal bonding layer includes a metal-to-metal bonding interface.

39. The method of claim 33, wherein the metal bonding layer includes a first metal layer formed on the interconnect region and a second metal layer formed on the donor layer.

* * * * *